(12) United States Patent
Kuroda et al.

(10) Patent No.: US 6,187,482 B1
(45) Date of Patent: Feb. 13, 2001

(54) MASK FOR EVANESCENT LIGHT EXPOSURE, OBJECT TO BE EXPOSED AND APPARATUS USING SAME

(75) Inventors: Ryo Kuroda, Kawasaki; Junji Ohyama, Yokohama, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/274,110

(22) Filed: Mar. 23, 1999

(30) Foreign Application Priority Data

Mar. 25, 1998 (JP) .................................................. 10-077287

(51) Int. Cl.[7] .................................. G03F 9/00; G03C 5/00
(52) U.S. Cl. .................................................. 430/5; 430/322
(58) Field of Search ........................... 430/5, 320; 355/53

(56) References Cited

U.S. PATENT DOCUMENTS 5,928,815 * 7/1999 Martin ...................................... 430/5

FOREIGN PATENT DOCUMENTS 8-179493    7/1996   (JP) .

* cited by examiner

Primary Examiner—S. Rosasco
(74) Attorney, Agent, or Firm—Fitzpatrick, Cella, Harper & Scinto

(57) ABSTRACT

A mask is used in an evanescent light exposure apparatus in which the mask, with a front side provided with minute aperture patterns, is disposed opposite to an object to be exposed. The mask is irradiated with light from its back side, and the object is exposed to the minute aperture patterns, whereby the patterns are transferred thereto, by evanescent light that emerges from the minute aperture patterns. The outermost surface on the front side of the mask has an adsorption preventor.

4 Claims, 10 Drawing Sheets

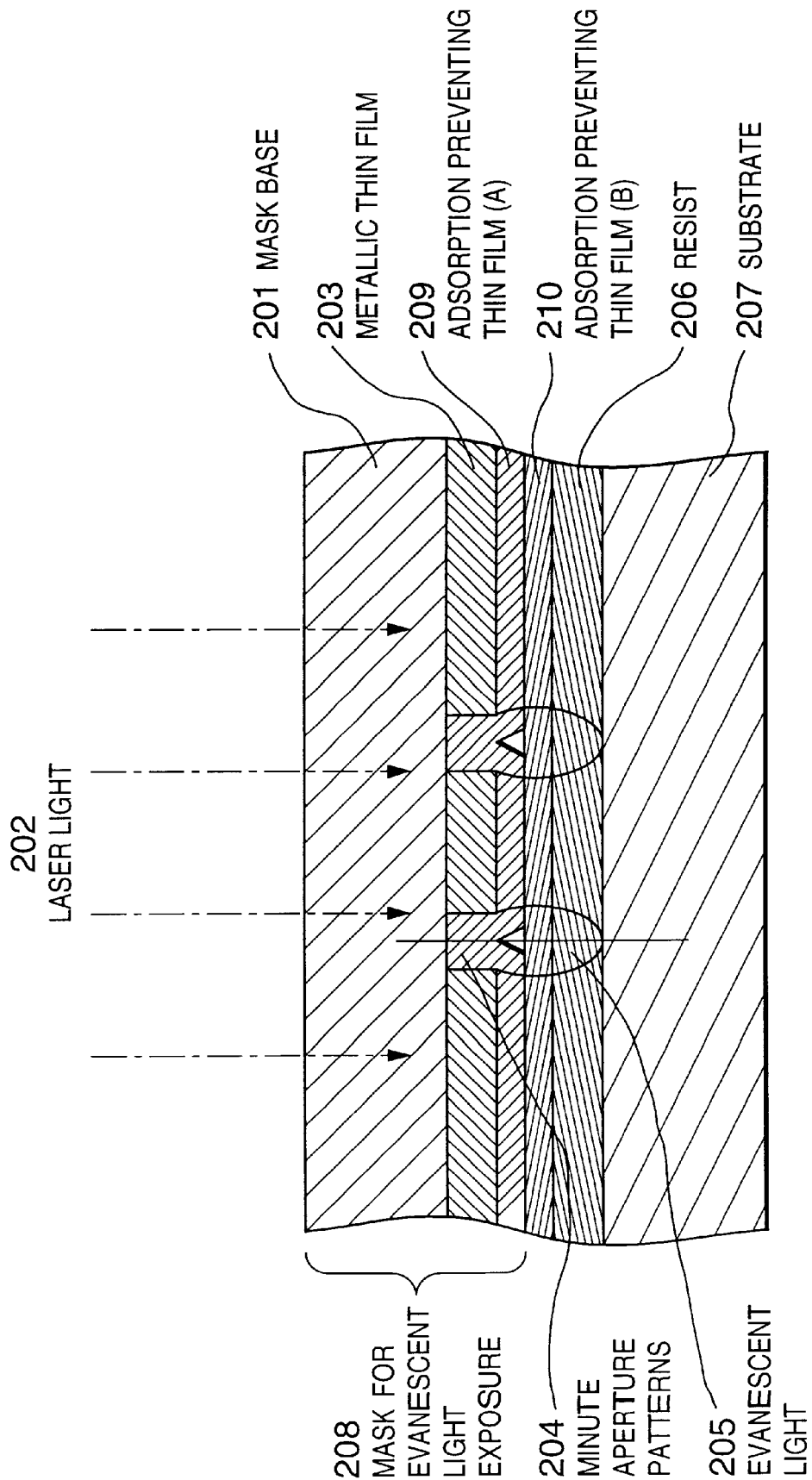

- 404 Cr THIN FILM
- 402 Si₃N₄ THIN FILM
- 401 Si SUBSTRATE
- 403 Si₃N₄ THIN FILM

- 407 EXPOSURE PATTERN
- 406 ELECTRON BEAM
- 405 ELECTRON BEAM RESIST

- 408 MINUTE APERTURE PATTERNS
- 409 ETCHING WINDOW

- 410 THIN-FILM SHAPED MASK

- 411 ADSORPTION PREVENTING THIN FILM (A)

- 412 MASK SUPPORTING MEMBER

- 503
- 702 MONOMOLECULAR FILM
- 701 WATER BATH
- 703 SUBSTRATE

- 702
- 703

MASK FOR EVANESCENT LIGHT EXPOSURE, OBJECT TO BE EXPOSED AND APPARATUS USING SAME

BACKGROUND OF THE INVENTION

This invention relates to a mask and an object to be exposed used in a micromachining apparatus, as well as to an exposure apparatus using the mask and the object.

Increasingly fine photolithography has become essential with the advancements that have been made in increasing the capacity of semiconductor memories, raising the speed of CPUs and increasing the density of integration thereof. In general, the limit on micromachining in photolithographic equipment is decided by the wavelength of the light used. Consequently, light of ever shorter wavelengths is being used in photolithographic equipment. Currently, lasers in the near ultraviolet range of wavelengths are being employed and it has become possible to perform micromachining on the order of 0.1 μm.

Problems that must be solved in order to achieve micromachining on the order of less than 0.1 μm with ever finer photolithography include shortening the wavelengths of lasers and the development of lenses for use in this wavelength region.

A micromachining apparatus using a scanning near-field optical microscope (referred to as an "SNOM" below) has been proposed as means for making possible micromachining on the order of less than 0.1 μm using light. For example, there is an apparatus that subjects a resist to local exposure that exceeds the limit on the wavelength of light by using evanescent light that emerges from minute apertures having a size of less than 100 nm.

However, existent examples of lithographic equipment using the SNOM arrangement carry out micromachining in the manner of single strokes using a single machining probe (or several such probes). A problem encountered, therefore, is that throughput cannot be made very high.

A method proposed to solve this problem (see the specification of Japanese Patent Application Laid-Open No. 08-179493) includes providing an optical mask with a prism, causing light to impinge upon the prism at the angle of total reflection, and transferring the pattern of the optical mask to a resist at one time using evanescent light that emerges from the surface of total reflection.

With the full-wafer exposure apparatus relying upon evanescent light using a prism as described in the above-mentioned Japanese Patent Application Laid-Open No. 08-179493, it is vital that the spacing between the prism mask and the surface of the resist be set to less than 100 nm. In actuality, however, there is a limit upon the surface precision of the prism mask and substrate and it is difficult to achieve the spacing of less than 100 nm between the prism mask and resist surface over the entire surface of the prism mask. In addition, if there is even the slightest skew between the prism mask and substrate when aligning the same, it is difficult to achieve the spacing of less than 100 nm between the prism mask and substrate over the entire surface of the prism mask.

If the prism mask is adhered to the resist surface by forcibly pressing it against the surface under these conditions, the substrate may be deformed, causing irregularities in the exposure pattern, or the resist ay be partially crushed by the prism mask.

Accordingly, a method that has been considered involves forming the mask of a resilient material and elastically deforming the mask so as to conform to the shape of the resist surface, whereby the surface of the mask is adhered to the surface of the resist.

In order to bring the mask surface into adhering contact even with finer structures on the resist surface, it is desired that the mask be made thinner. In a case where the mask is peeled off the surface of the resist after the mask surface is adhered to the resist surface and exposure carried out, there are occasions where the mask is damaged owing to the adsorbability of the mask surface to the resist surface, or where the member forming the mask pattern peels off from the mask base material owing to adsorption to the side of the resist. These difficulties can cause a decrease in yield.

SUMMARY OF THE INVENTION

Accordingly, an object of the present invention is to provide a mask for evanescent light exposure, an exposed object and an exposure apparatus using the mask and object.

According to the present invention, the foregoing object is attained by providing a mask for evanescent light exposure used in an evanescent light exposure apparatus in which a mask having a front side provided with minute aperture patterns is disposed with its front side opposing an object to be exposed, the mask is irradiated with light from a back side thereof, and the object is exposed to the minute aperture patterns, whereby the patterns are transferred thereto, by evanescent light that emerges from the minute aperture patterns, wherein an outermost surface on the front side of the mask has adsorption preventing means.

Further, according to the present invention, the foregoing object is attained by providing an object to be exposed used in an evanescent light exposure apparatus in which a mask having a front side provided with minute aperture patterns is disposed with its front side opposing the object to be exposed, the mask is irradiated with light from a back side thereof, and the object is exposed to the minute aperture patterns, whereby the patterns are transferred thereto, by evanescent light that emerges from the minute aperture patterns, wherein an outermost surface of the object to be exposed has adsorption preventing means.

Further, according to the present invention, the foregoing object is attained by providing an evanescent light exposure apparatus in which a mask having a front side provided with minute aperture patterns is disposed with its front side opposing the object to be exposed, the mask is irradiated with light from a back side thereof, and the object is exposed to the minute aperture patterns, whereby the patterns are transferred thereto, by evanescent light that emerges from the minute aperture patterns, wherein adsorption preventing means is provided between an outermost surface on the front side of the mask and an outermost surface of the object to be exposed.

Further, according to the present invention, the foregoing object is attained by providing an evanescent light exposure method in which a mask having a front side provided with minute aperture patterns is disposed with its front side opposing said object to be exposed, the mask is irradiated with light from a back side thereof, and the object is exposed to the minute aperture patterns, whereby the patterns are transferred thereto, by evanescent light that emerges from the minute aperture patterns, wherein an outermost surface on the front side of the mask and an outermost surface of the object are comprised by respective materials which do not produced bonding with each other at a molecular level.

Further, according to the present invention, the foregoing object is attained by providing an evanescent light exposure method in which a mask having a front side provided with minute aperture patterns is disposed with its front side opposing said object to be exposed, the mask is irradiated with light from a back side thereof, and the object is exposed to the minute aperture patterns, whereby the patterns are transferred thereto, by evanescent light that emerges from said minute aperture patterns, wherein an outermost surface on the front side of the mask and an outermost surface of the object include respective materials which have respective properties different from each other with respect to affinity.

In accordance with the present invention, the adsorbability of a mask for evanescent light exposure to an object to be exposed can be reduced when the mask is peeled off the object, and it is possible to avoid adsorption of the mask with respect to the resist surface of the object to be exposed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 2 is a diagram useful in describing an exposure principle using evanescent light;

DESCRIPTION OF THE PREFERRED EMBODIMENT

The present invention will now be described in detail with reference to the drawings.

Figure 1:
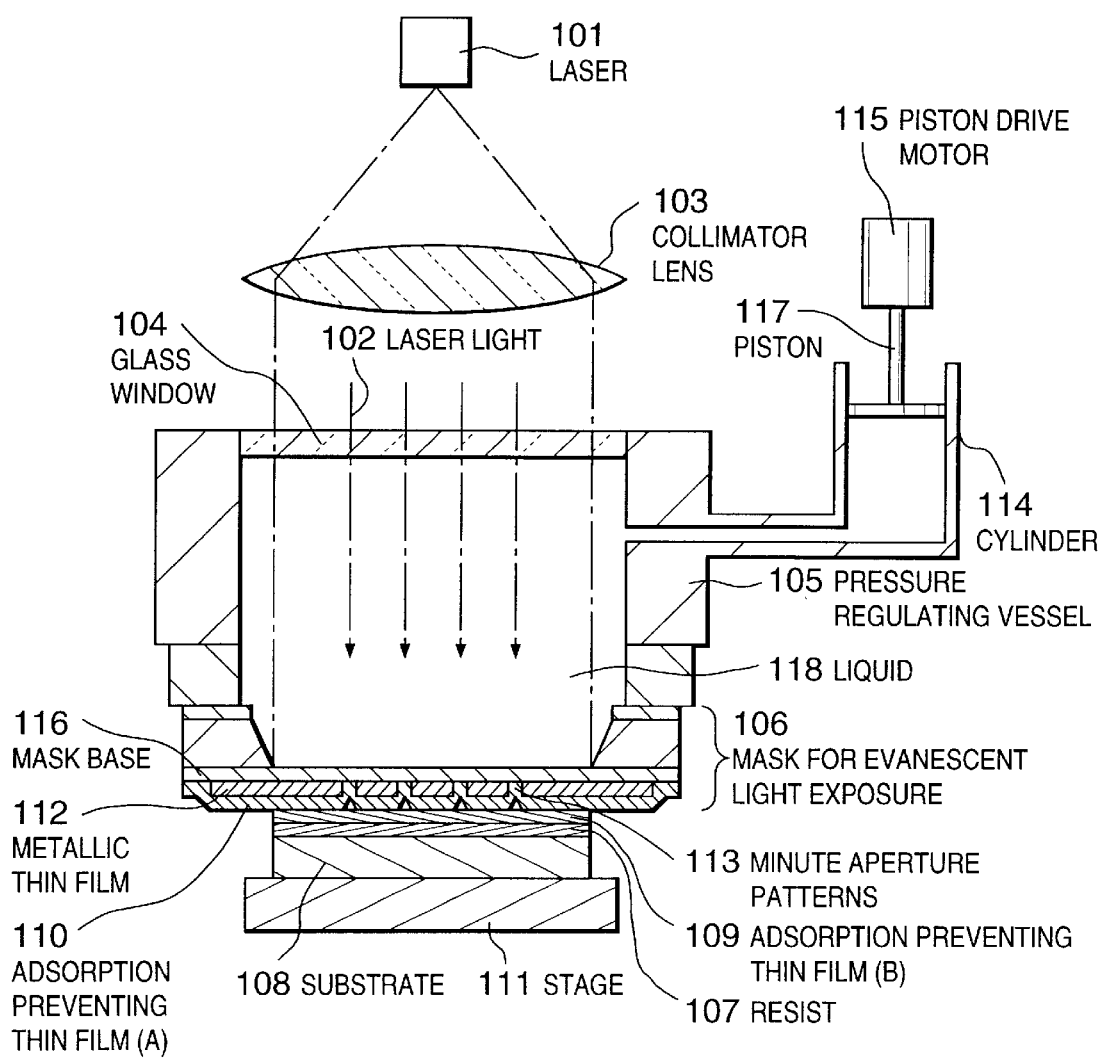
FIG. 1 is a diagram showing the construction of an exposure apparatus using a mask for evanescent light exposure according to the present invention.

FIG. 1 is a diagram showing the construction of an exposure apparatus using a mask for evanescent light exposure according to the present invention.

As shown in FIG. 1, a mask 106 for evanescent light exposure is used as the exposure mask of the present invention. The mask 106 is constituted by a mask base 116, a metallic thin film 112 and an adsorption preventing thin film (A) 110. The lower side of the mask base 116 is provided with the metallic thin film 112, which is formed to have minute aperture patterns 113. The adsorption preventing thin film (A) 110 is formed so as to cover the entire surface of the metallic thin film 112.

The mask 106 for evanescent light exposure is arranged with its front side (the lower side in FIG. 1) facing the outside of a pressure regulating vessel 105 and with its back side (the upper side in FIG. 1) facing the interior of the pressure regulating vessel 105. The pressure regulating vessel 105 is so adapted that the pressure within can be regulated.

An object to be exposed is obtained by forming a resist 107 on the surface of a substrate 108 and forming an adsorption preventing thin film (B) 109 on the resist 107 so as to cover the entire surface thereof. It is so arranged that the surface of the adsorption preventing thin film (A) 110 and the surface of the adsorption preventing thin film (B) 109 have mutually different properties in relation to affinity, i.e., one surface being hydrophilic and the other being hydrophobic. The adsorption preventing thin film (B) 109, resist 107 and substrate 108 are mounted on a stage 111. Moving the stage 111 moves the substrate 108 relative to the mask 106 so that the substrate 108 is positioned in two dimensions in the plane of the mask 106. Next, the stage 111 is driven normal to the mask surface so that the front side of the mask 6 and the surface of the resist 107 on the substrate 108 will be brought into adhering contact, with the adsorption preventing thin films (A) 110 and (B) 109 interposed therebetween, in such a manner that the spacing between them will be less than 100 nm over the entire surface.

Thereafter, laser light 102 emitted from an exposure laser 101 is collimated by a collimator lens 103, after which the collimated light passes through a glass window 104 and is introduced into the pressure regulating vessel 105. As a result, the mask 106 for evanescent light exposure disposed within the pressure regulating vessel 105 is irradiated with the light from its back side (the top side in FIG. 1) so that the resist 107 is exposed by evanescent light that emerges from the minute aperture patterns 113 formed in the metallic thin film 112 on the mask base 116 disposed on the front side of the mask 106.

The principle of exposure by evanescent light will be described with reference to FIG. 2.

As shown in FIG. 2, laser light 202 that impinges upon a mask base 201 constituting a mask 208 for evanescent light exposure irradiates minute aperture patterns 204 formed in a metallic thin film 203. The size (width) of the minute aperture patterns 204 is less than 100 nm, which is small in comparison with the wavelength of the laser light 202.

Ordinarily, light cannot pass through an aperture whose size is smaller than the wavelength of the light. However, a slight amount of light, referred to as evanescent light 205, does emerge from the vicinity of the apertures. This light is non-propagating light that exists only at a distance of less than 100 nm or so from the apertures and its intensity decreases sharply with distance from the apertures.

A resist 206 is made to approach to within a distance of less than 100 nm from the minute aperture patterns 204 from which the evanescent light 205 emerges. As a result, the evanescent light 205 exposes the resist 206 upon being scattered in adsorption preventing thin films (A) 209 and (B) 210 and resist 206.

If the film thicknesses of the adsorption preventing thin films (A) 209 and (B) 210 and resist 206 are sufficiently small, the scattering of evanescent light in the resist 206 will not broadened very much within the plane (i.e., transversely) and the resist can be exposed to minute patterns, which correspond to the minute aperture patterns 204 whose size is less than the wavelength of the laser light 202, whereby the patterns can be transferred to the resist.

After exposure by the evanescent light is carried out, a substrate 207 bearing the resist 206 is treated using an ordinary process. For example, after the resist is developed, the minute patterns corresponding to the minute aperture patterns 204 are formed on the substrate 207 by etching.

Reference will be had to FIG. 1 to describe the details of a method of adhering the mask for evanescent light exposure and the resist/substrate.

If the front side of the mask 106 for evanescent light exposure and the surface of the resist 107 on the substrate 108 are both perfectly flat, then it will be possible to adhere the two together over their entire surfaces. In actuality, however, the surface of the mask 106 and the surface of the resist 107/substrate 108 have irregularities and waviness and merely bringing them together to contact them will result in a mixture of adhered and non-adhered portions.

Accordingly, pressure is applied to the mask 106 from its back side to its front side, thereby causing the mask 106 to flex owing to elastic deformation and pressing the mask against the resist 107/substrate 108, whereby the two can be adhered over their entire surfaces.

A method of applying such pressure involves disposing the mask 106 with its back side facing the interior of the pressure regulating vessel 105 and its front side facing the exterior of the pressure regulating vessel 105, as shown in FIG. 1, introducing a liquid or gas into the interior of the pressure regulating vessel 105 and elevating the interior of the pressure regulating vessel 105 to a pressure higher than that of the external atmosphere.

In this embodiment, the interior of the pressure regulating vessel 105 is filled with a liquid 118 that is transparent to the laser light 102, and the pressure regulating vessel 105 is connected to a cylinder 114. A piston 117 within the cylinder 114 is driven by a piston drive motor 115, whereby the pressure of the liquid 118 inside the pressure regulating vessel 105 can be regulated.

The piston 117 is driven downward in FIG. 1 to increase the pressure of the liquid 118 to adhere the front surface of the mask 106 and the surface of the resist 107 on the substrate 108 at a uniform pressure over their entire surfaces via the intermediary of the adsorption preventing thin films (A) 110 and (B) 109.

When pressure is applied through this method, a repulsive force that acts between the front surface of the mask 106 and the surface of the resist 107 on the substrate 108 is rendered uniform in accordance with Pascal's Law. As a result, neither the mask 106 nor the surface of the resist on the substrate 108 is subjected locally to large forces and neither the mask 106, substrate 108 nor resist 107 sustains local damage.

By regulating the pressure within the pressure regulating vessel 105 at this time, the pressing force, i.e., the force of adhesion, acting between the mask 106 and resist 107/substrate 108 can be controlled. For example, when unevenness or waviness of the surface of mask 106 or the surface of the resist 107/substrate 108 is large, setting the pressure within the pressure regulating vessel 105 to a high value will increase the force of adhesion and make it possible to eliminate variance in the spacing between the surface of the mask 106 and the resist 107/substrate 108 caused by unevenness or waviness.

In order to adhere the mask 106 for evanescent light exposure to the resist 107/substrate 108, an example has been illustrated in which the back side of the mask 106 is disposed within the pressure regulating vessel 105 and pressure is applied to the mask 106 from its back to its front side by a pressure differential between the pressure within the vessel 105 and the lower, exterior atmospheric pressure. However, it is permissible to adopt the reverse arrangement, in which the front side of the mask 106 and the resist 107/substrate 108 are disposed within a depressurizing vessel and pressure is applied to the mask 106 from its back to its front side by a pressure differential between the pressure within the depressurizing vessel and the higher, exterior atmospheric pressure. In any case, it will suffice to provide a pressure differential such that the back side of the mask 106 will be subjected to a pressure higher than that acting upon its front side.

Separating the mask 106 for evanescent light exposure and the resist 107/substrate 108 by peeling after the exposure to the evanescent light output is performed in the manner described below.

The piston 117 is driven upward in FIG. 1 using the piston drive motor 115, thereby making the pressure within the pressure regulating vessel 105 lower than the external atmospheric pressure and causing the adsorption preventing thin film (A) 110 on the metallic thin film 112/mask 106 to peel off the adsorption preventing film (B) 109 on the resist 107/substrate 108.

As mentioned above, the surface of the adsorption preventing thin film (A) 110 and the surface of the adsorption preventing thin film (B) 109 have mutually different properties in relation to affinity, i.e., one surface being hydrophilic and the other being hydrophobic. Since cohesive strength such as hydrogen bonding is not produced at the molecular level, the two films have no affinity for each other and a large adsorbability is not produced. Accordingly, when the adhered resist 107/substrate 108 and mask 106 are separated by peeling, the adsorption preventing thin films (A) 110 and (B) 109 readily peel off each other.

By thus reducing adsorbability at the time of peeling, it is possible to avoid damage to the mask base 116 of the mask 106, the metallic thin film 112 in which the minute aperture patterns 113 have been formed, the resist 107 and substrate 108.

In a case where depressurization is performed to peel the mask 106 off the resist 107/substrate 108 through this method, an attraction force that acts between the front surface of the mask 106 and the surface of the resist 107 on the substrate 108 is rendered uniform in accordance with Pascal's Law. As a result, neither the mask 106 nor the surface of the resist on the substrate 108 is subjected locally to large forces and neither the mask 106, substrate 108 nor resist 107 sustains local damage.

By regulating the pressure within the pressure regulating vessel 105 at this time, the attraction force, i.e., the pulling force between the mask 106 and resist 107/substrate 108, can be controlled. For example, when the adsorbability between the mask 106 and resist 107/substrate 108 is large, setting the pressure within the pressure regulating vessel 105 to a lower value will increase the pulling force and make it easier to achieve separation by peeling.

In a case where the arrangement of the apparatus for applying pressure at the time of adhesion is the reverse of that shown in FIG. 1, namely in which the front side of the mask 106 and the resist 107/substrate 108 are disposed within a depressurizing vessel and pressure is applied to the mask 106 from its back to its front side by a pressure differential between the pressure within the depressurizing and the higher, exterior atmospheric pressure, it will suffice to make the pressure within the vessel higher than the atmospheric pressure outside the vessel at the time of separation by peeling.

In any case, it will suffice to provide a pressure differential such that the back side of the mask 106 will be subjected to a pressure lower than that acting upon its front surface.

Figure 3A:
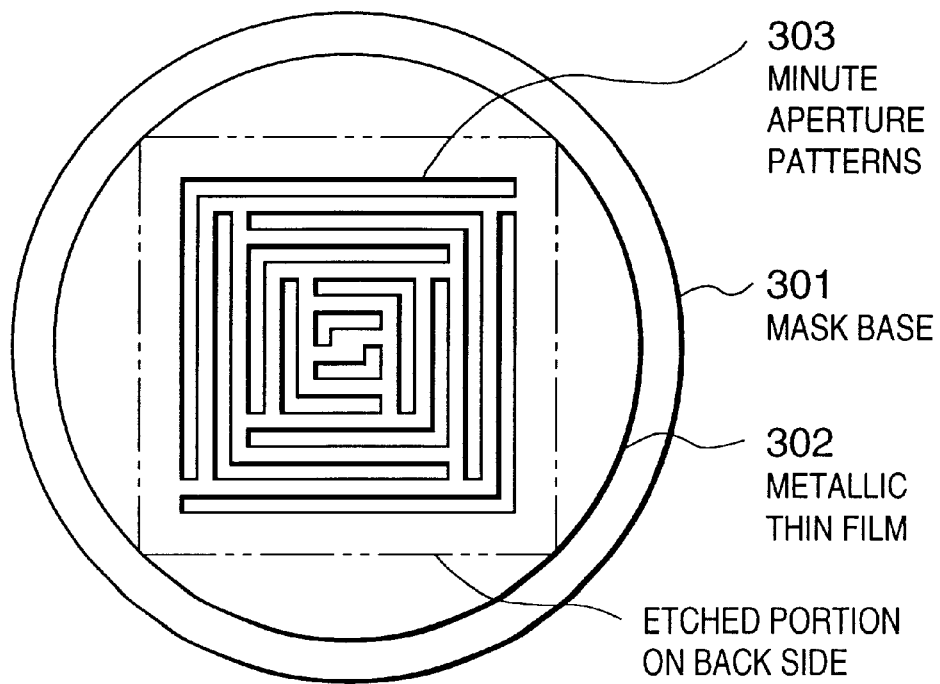
FIG. 3A is a top view.
Figure 3B:
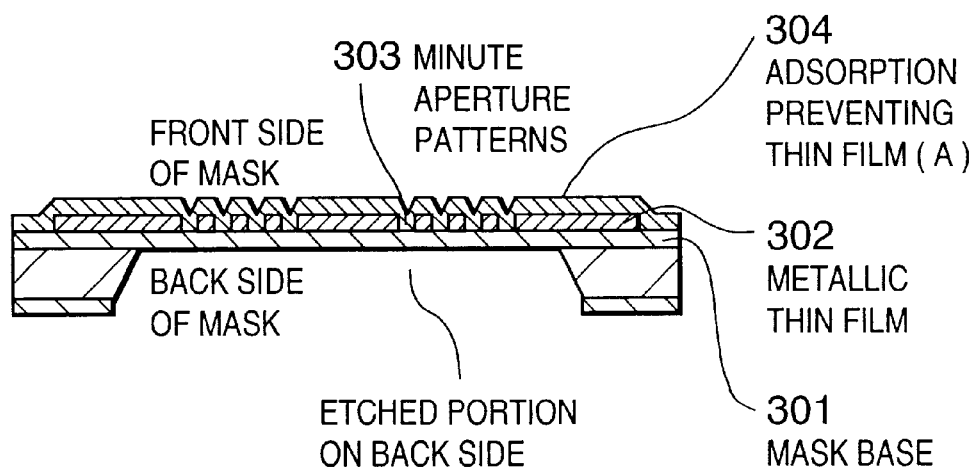
FIG. 3B a sectional view showing the structure of a mask for evanescent light exposure according to this invention.

FIGS. 3A and 3B illustrate the structure of the mask 106 for evanescent light exposure according to the present invention. FIG. 3A is a view as seen from the front side of the mask 106, and FIG. 3B is a sectional view of the mask.

The mask 106 shown in FIGS. 3A and 3B is obtained by forming a metallic thin film 302 to a film thickness of 10 to 100 nm on a mask base 301 comprising a thin film having a film thickness of 0.1 to 100 $\mu$m, forming minute aperture patterns 303 having a width of less than 300 nm in the thin film 302, and forming an adsorption preventing thin film (A) 304 thereon to a film thickness of 1 to 10 nm for the purpose of preventing adsorption.

Selected as the material of the mask base 301 is a resilient body transparent to the wavelength of the exposing light and capable of flexing in the direction normal to the mask surface owing to elastic deformation. Examples of the material include $Si_3N_4$ and $SiO_2$.

If the mask base 301 has a small thickness, it will be capable of undergoing elastic deformation more easily so as to conform to finer, larger unevenness and waviness of the resist/substrate surface. This provides better adhesion. However, if the mask base 301 is too thin relative to the area exposed to light, the strength of the mask will be inadequate and the mask may be destroyed by the adsorbability between the mask and the resist/substrate when peeling is performed after adhesion and exposure.

Thus, it is preferred that the mask base 301 having a thickness within the range of 0.1 to 100 $\mu$m.

In order to maximize the strength of the evanescent light that emerges from the minute aperture patterns 303 on the mask, it is required that the length of the minute apertures (in the direction normal to the mask surface) be reduced. To this end, it is desired that the film thickness of the metallic thin film 302 be made as small as possible.

If the metallic thin film 302 is made too thin, however, the metallic thin film 302 will be rendered discontinuous and light will leak from portions other than the minute aperture patterns 303. Accordingly, the desired film thickness of the metallic thin film 302 is 10 to 100 nm.

If the surface of the metallic thin film 302 on the side adhered to the resist/substrate is not flat, the mask and resist/substrate will not adhere to each other well and uneven exposure will be caused as a result. For this reason, the surface of the metallic thin film 302 is required to be extremely flat, i.e., the size of irregularities on the surface of the metallic thin film 302 should be less than 100 nm and preferably less than 10 nm.

The width of the minute aperture patterns 303 is made less than the wavelength of the light used in exposure, namely the pattern exposure width desired for the resist. More specifically, the width of the minute aperture patterns 303 should be selected from the range of 1 to 100 nm. Providing the minute aperture patterns 303 with a width greater than 100 nm is undesirable in that direct light of greater intensity than evanescent light will pass through the mask in addition to the evanescent light that is the object of this invention. If the width of the minute aperture patterns 303 is made less than 1 nm, on the other hand, exposure will not be impossible but the intensity of the evanescent light that emerges from the mask will be extremely small and exposure will take too much time. An aperture pattern of such width, therefore, is impractical.

Though the width of the minute aperture patterns 303 is required to be less than 100 nm, there is no limit upon length in the longitudinal direction and the patterns can be selected freely in this direction. For example, the hook-shaped pattern shown in FIG. 3A may be used and so may an S-shaped pattern (not shown).

The adsorption preventing thin film (A) 304 that is chosen should have a property that is the opposite of the adsorption preventing thin film (B) on the resist/substrate in relation to affinity, i.e., the surface of one should be hydrophilic and the surface of the other should be hydrophobic.

In case where the surface of the adsorption preventing thin film (B) is hydrophilic, for example, the material constituting the adsorption preventing thin film (A) 304 is selected so that the surface thereof will be hydrophobic. An example of a material whose surface exhibits a hydrophobic property is one having one or more long-chain alkyl groups or trifluoro groups, which are functional groups exhibiting the hydrophobic property, in their molecules. This material should be made into a film while controlling the molecular orientation in such a manner that these functional groups are brought to the surface side. Further, a macromolecular compound that is insoluble in water, e.g., polymethacrylate derivative or a polyacrylate derivative, may be produced as the film.

Conversely, in a case where the surface of the adsorption preventing thin film (B) is hydrophobic, for example, the material constituting the adsorption preventing thin film (A) 304 is selected so that the surface thereof will be hydrophilic. An example of a material whose surface exhibits a hydrophilic property is one having carboxyl groups, sulfate groups ($SO_3$—) or amino groups, which are functional groups exhibiting the hydrophilic property ,in their molecules. This material should be made into a film while controlling the molecular orientation in such a manner that these functional groups are brought to the surface side.

Though an example in which the adsorption preventing thin film (a) 304 is formed as a film on the metallic thin film 302 has been described above, the invention as claimed is not limited to this example and covers also utilization of the affinity (hydrophilic or hydrophobic) of the surface of the metallic thin film 302 itself.

More specifically, if a material, such as gold or platinum, on the surface of which an oxide film will not form is selected as the material of the metallic thin film 302, the surface of the metallic thin film 302 will not readily become hydrophilic, i.e., will exhibit a hydrophobic property, unlike the case with a metal material that produces an oxide film, described later. Accordingly, in a case where the surface of the adsorption preventing thin film (B) on the side of the resist/substrate is a material exhibiting the hydrophilic property, the adsorption preventing thin film (A) is not formed on the upper side of the metallic thin film 302 but is used directly in the evanescent light exposure apparatus of the present invention as the mask for evanescent light exposure.

Further, if a material, such as chromium or aluminum, on the surface of which an oxide film will form in the atmosphere is selected as the material of the metallic thin film 302, the surface of the metallic thin film 302 will exhibit a hydrophilic property. Accordingly, in a case where the surface of the adsorption preventing thin film (B) on the side of the resist/substrate is a material exhibiting the hydrophobic property, the adsorption preventing thin film (A) is not formed on the upper side of the metallic thin film 302 but is used directly as the mask for evanescent light exposure in the evanescent light exposure apparatus of the present invention.

Thus, as described above, a pair of adsorption preventing thin films exhibiting opposite affinities are formed between a metallic thin film of a mask for evanescent light exposure and a resist/substrate, thereby making it possible to reduce the adsorbability of the mask with respect to the resist/ substrate. When the mask is peeled off the resist/substrate, it is possible to avoid a situation in which the metallic thin film is adsorbed onto the resist surface and stripped off the mask base, or a situation in which the mask base is destroyed.

The details of a method of fabricating the mask for evanescent light exposure according to this invention will now be described with reference to FIGS. 4A to 4F.

Figure 4A:
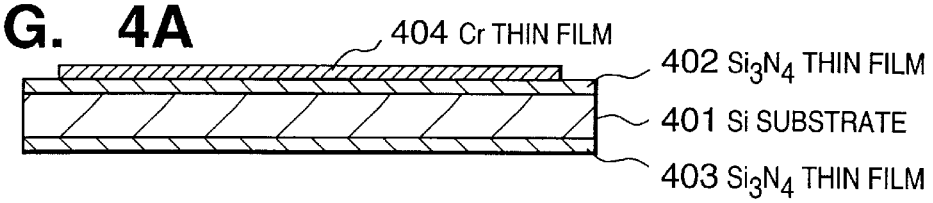
FIGS. 4A to 4F are sectional views showing the steps of a process for fabricating a mask for evanescent light exposure.

As shown in FIG. 4A, an $Si_3N_4$ thin film 402 serving as a mask base and an $Si_3N_4$ thin film 403 serving as an etching window are formed to a film thickness of 2 $\mu$m on the front surface (the top surface in FIG. 4A) and back surface (the bottom surface in FIG. 4A), respectively, of a 500-$\mu$m thick silicon (100) substrate 401, both surfaces of which have been polished, using the LP-CVD process. A chromium thin film 404 is then formed by the vapor deposition method to a thickness of 30 nm on the $Si_3N_4$ thin film 402 as a metallic thin film for forming minute aperture patterns.

Figure 4B:
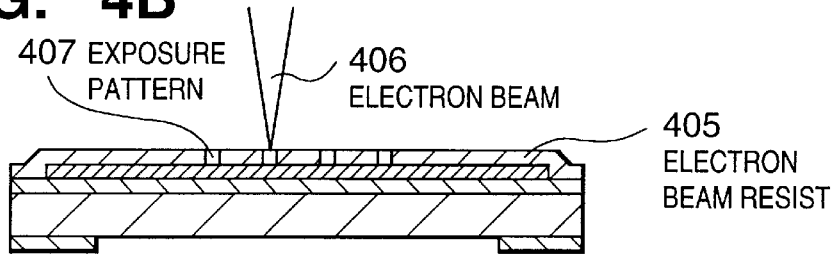

Next, as shown in FIG. 4B, the surface is coated with an electron beam resist 405 and an exposure pattern 407 having a width of less than 10 nm is formed in the resist by an electron beam 406. After the resist is developed it is etched away by $CCl_4$, thereby forming minute aperture patterns 408 in the thin film 404 of chromium, as shown in FIG. 4C.

Figure 4C:
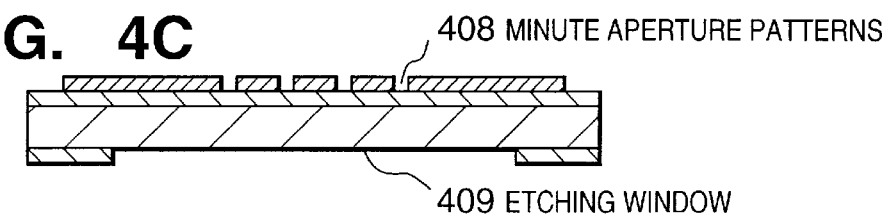
Figure 4D:
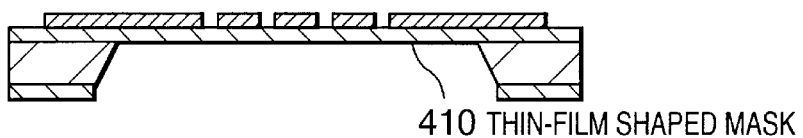

An etching window 409 is then formed in the thin film 403 of $Si_3N_4$ on the back side, as shown in FIG. 4C, and the silicon substrate 401 is subjected to anisotropic etching from its back side using KOH, thereby forming a mask 410 having the shape of a thin film, as shown in FIG. 4D.

Figure 4E:
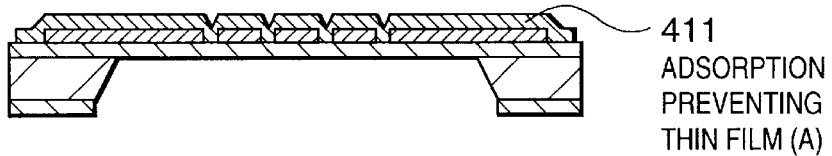
Figure 4F:
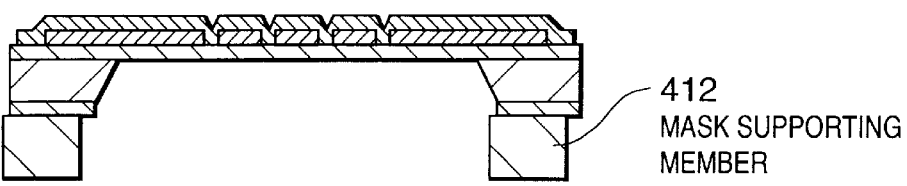

Next, as shown in FIG. 4E, a monomolecular film of an alkyl amine such as octadecyl amine is formed as an adsorption preventing thin film (A) 411 on the front surface of the thin-film shaped mask 410 using the LB (Langmuir-Blodgett) method, described in detail below, whereby the top side becomes a surface exhibiting a hydrophobic property. The resulting member is then bonded to a mask supporting member 412, as shown in FIG. 4F, to be used as a mask for evanescent light exposure.

This embodiment illustrates an example in which the LB method is used as a method of forming the adsorption preventing thin film (A) 411, the affinity of the surface of which has been regulated, on the front side of the thin-film shaped mask 410.

The LB method is a method of fabricating an ultra-thin film in which monomolecular films of an organic material oriented on a water surface are built up on a substrate. The ultra-thin film formed by this method is referred to as an "LB film". The LB method will now be described.

Figure 5A:
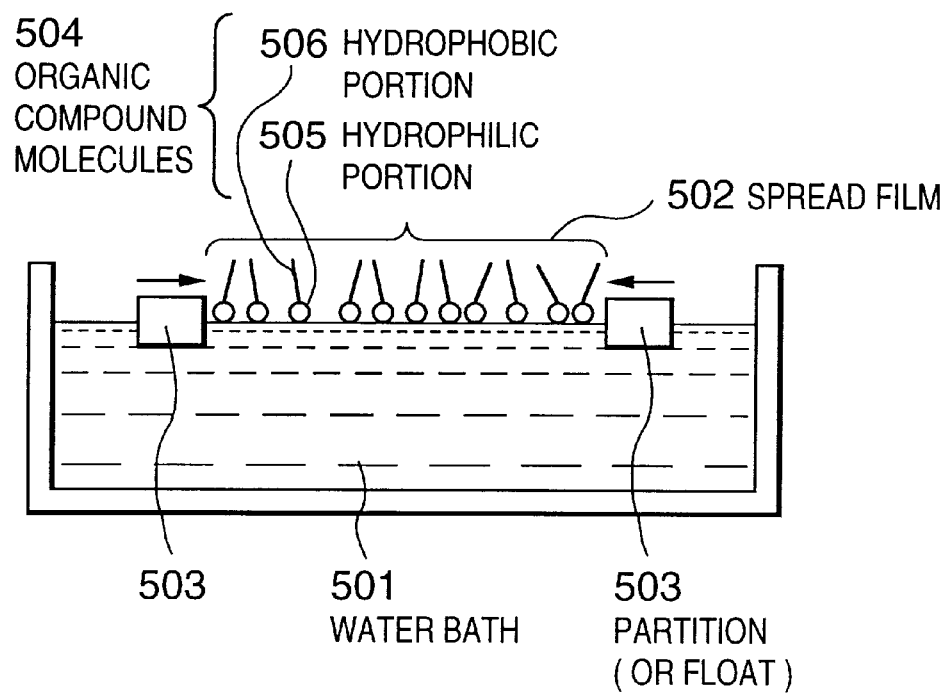
FIGS. 5A and 5B are explanatory views illustrating the initial stages of a process for transferring a monomolecular film or built-up film in the LB (Langmuir-Blodgett) method.

An amphiphatic organic compound having in one molecule a portion exhibiting the hydrophobic property, such as a saturated/unsaturated hydrocarbon radical or condensation polycyclic aromatic group, and a portion exhibiting the hydrophilic property, such as a carboxyl group or ester group, is dissolved in a solvent such as chloroform or benzene. This solution is spread in a water bath 501 using an apparatus shown in FIGS. 5A and 5B. Organic compound molecules 504 spread into the form of a film on the surface of the water bath 501 in such a manner that hydrophilic portions 505 in the molecules point toward the side of the water bath surface and hydrophobic portions 506 in the molecules point away from the water bath surface (see FIG. 5A).

Figure 5B:
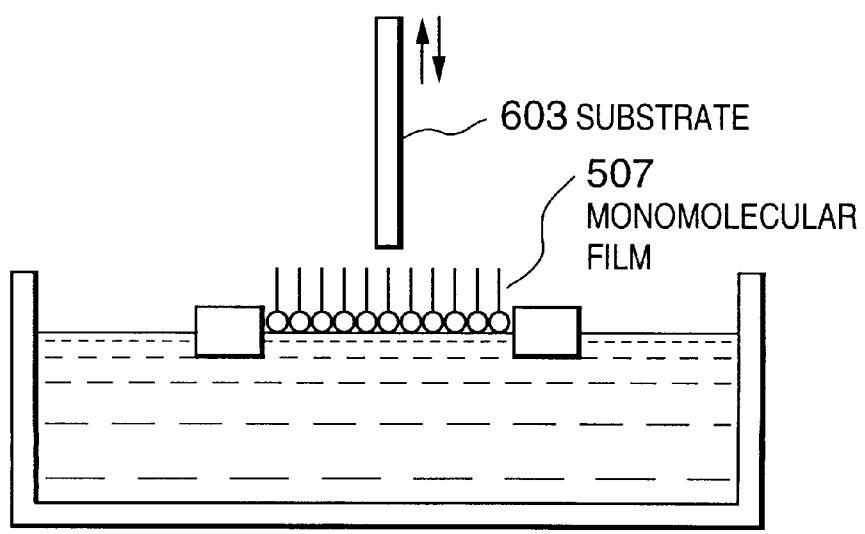
Figure 6A:
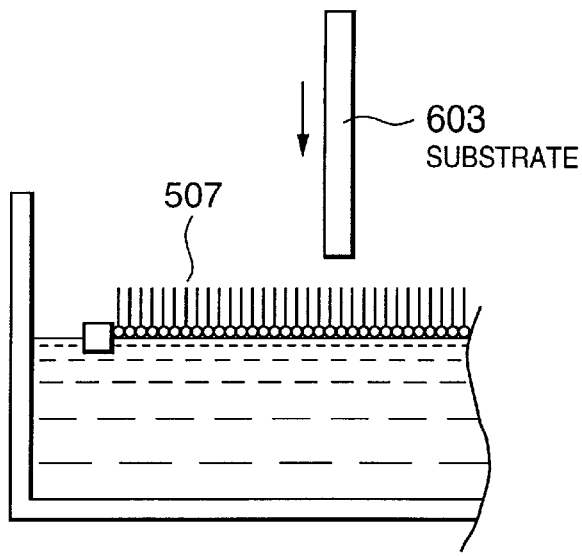
FIGS. 6A to 6C are explanatory views illustrating a process for transferring a monomolecular film or built-up film onto a substrate in the LB method.
Figure 6B:
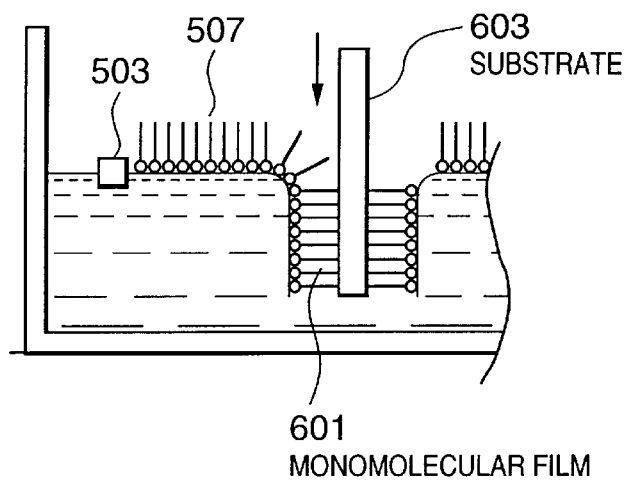
Figure 6C:
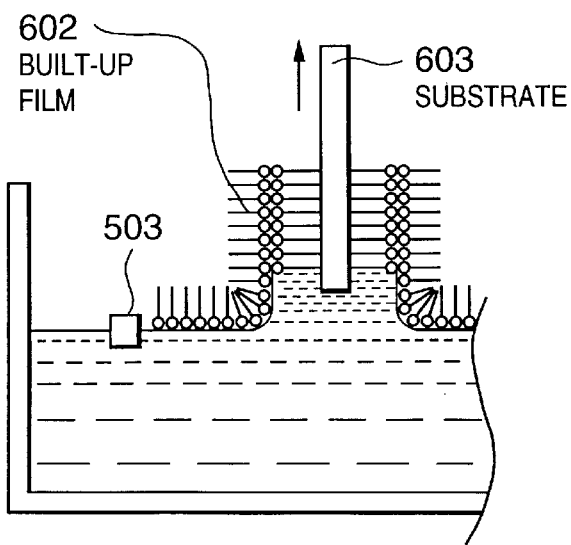

Partitions (or floats) 503 are provided so that the spread film 502 will not diffuse freely and spread out too much on the water bath 501. Thus the area of spread of the film 502 is limited to control the gathering of the organic compound molecules 504. The surface pressure that corresponds to this gathered state is sensed. The partitions 503 are moved to thereby reduce the area of spread and control the gathering of the molecules 504 so as to gradually elevate the surface pressure. This makes it possible to attain a surface pressure having a value suited to manufacture of a film (FIG. 5B). While the surface pressure is maintained, a hydrophobic substrate 603 (FIG. 6A) whose surface has been cleaned is gently lowered into the water bath vertically (FIG. 6B), or lowered and then raised from the water bath (FIG. 6C), whereby a monomolecular film 601, or built-up film 602, of the organic compound is transferred to the substrate 603. The monomolecular film 601 is a film which, as shown schematically in FIG. 8B, has its molecules oriented in good order with their hydrophilic portions 505 directed outward (upward in FIG. 8B) at the outermost surface.

Figure 8A:
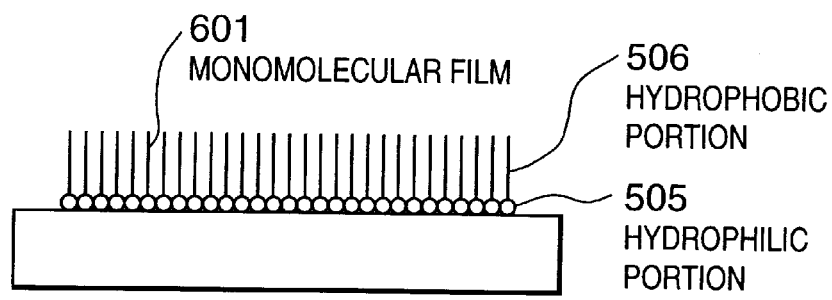
FIG. 8A is an explanatory view showing the structure of a monomolecular film having its hydrophobic portion facing upward.
Figure 8B:
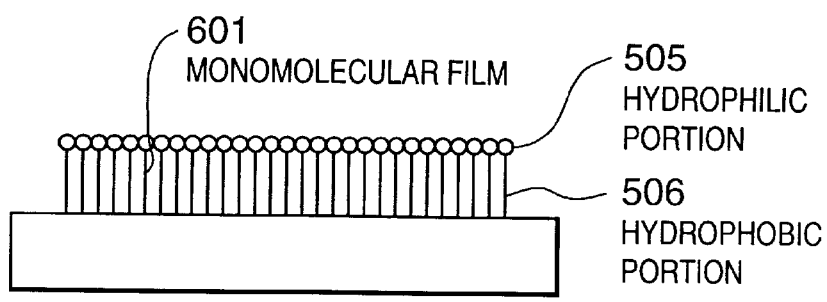
FIG. 8B is an explanatory view showing the structure of a monomolecular film having its hydrophilic portion facing upward.
Figure 8C:
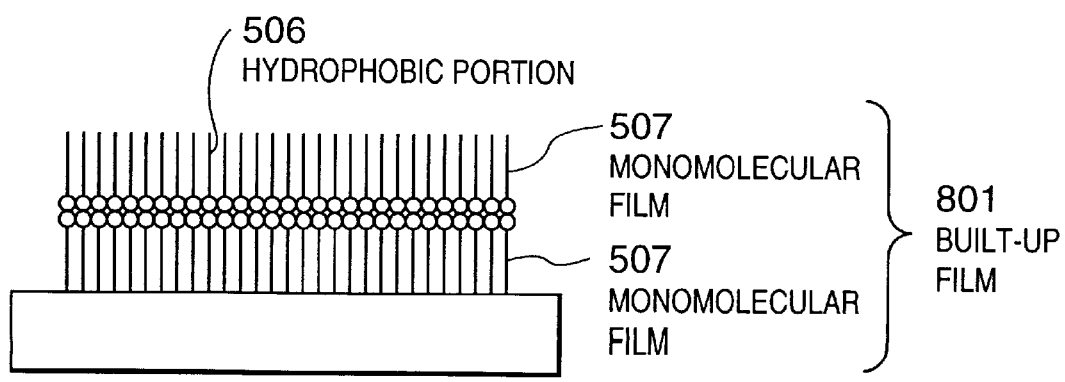
FIG. 8C is an explanatory view showing the structure of a built-up film.

The monomolecular film 601 is fabricated in the manner described above. By repeating the above-described operation a prescribed number of times, a built-up film having a prescribed number of layers is formed. FIG. 8C illustrates an example of a built-up film 801 having two layers in which the hydrophobic portions 506 are directed outward at the outermost surface.

In a case where an LB film is formed on the chromium thin film 304 on the front side of the thin-film shaped mask 410, as illustrated in this embodiment, a natural oxide film is formed on the surface of the thin film 304 in the atmosphere. The surface, therefore, exhibits the hydrophilic property.

Figure 7A:
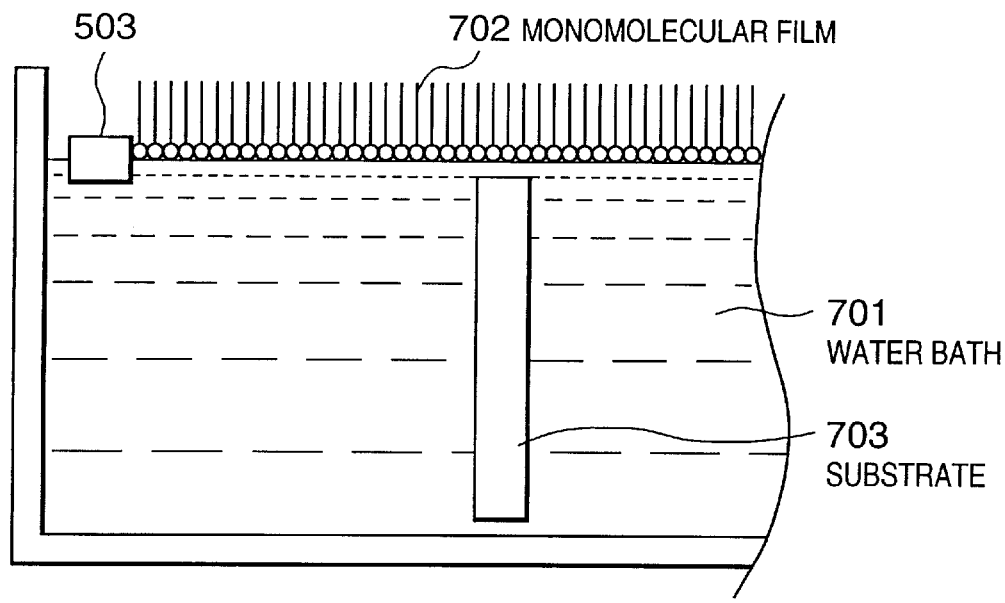
FIGS. 7A and 7B are views useful in describing the transfer of a monomolecular film to a hydrophilic substrate in the LB method.
Figure 7B:
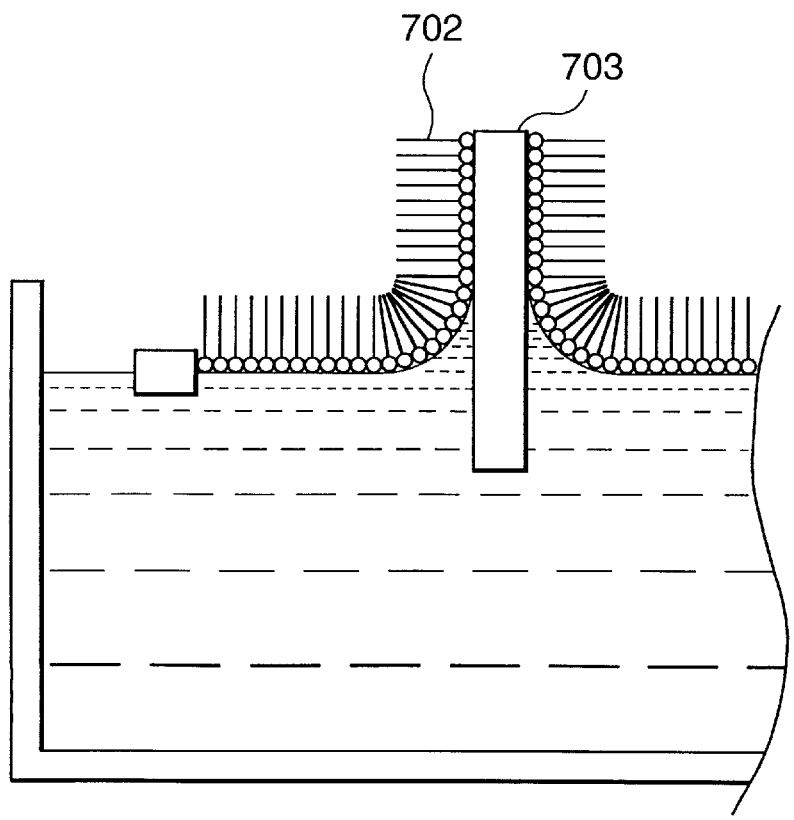

In order to form an LB film on a substrate whose surface is hydrophilic, the substrate, indicated at 703 in FIGS. 7A and 7B, is dipped into a water bath 701. A monomolecular film 702 is then formed on the surface of the water bath 701 (FIG. 7A) and the substrate 703 is raised gently in the vertical direction (FIG. 7B), whereby a monomolecular film 702 of an organic compound is transferred to the substrate 703. The monomolecular film 702 is a film which, as shown in FIG. 8A, has its molecules oriented in good order with their hydrophobic portions 506 directed outward (upward in FIG. 8A) at the outermost surface.

Though the details are not shown, it is possible during the process for forming the film by the LB method to remove the monomolecular film from the water bath while the substrate is left submerged in the water bath, and then raise the substrate from the bath, whereby a film having the hydrophilic portion directed outward at the outermost surface can be formed.

Thus, as illustrated above, it is possible with the LB film to change the affinity (i.e., to obtain the hydrophilic or hydrophobic property) of the outermost surface by the selection of the organic molecules and number of layers.

An example using the LB method has been described as a method of forming the adsorption preventing thin film (A), the affinity of the surface of which has been regulated, on the front side of the thin-film shaped mask 410. However, a Self-Assembled Monolayer (SAM) formation method can be mentioned as a second method of forming the adsorption preventing thin film (A) whose surface affinity has been regulated.

Figure 9:
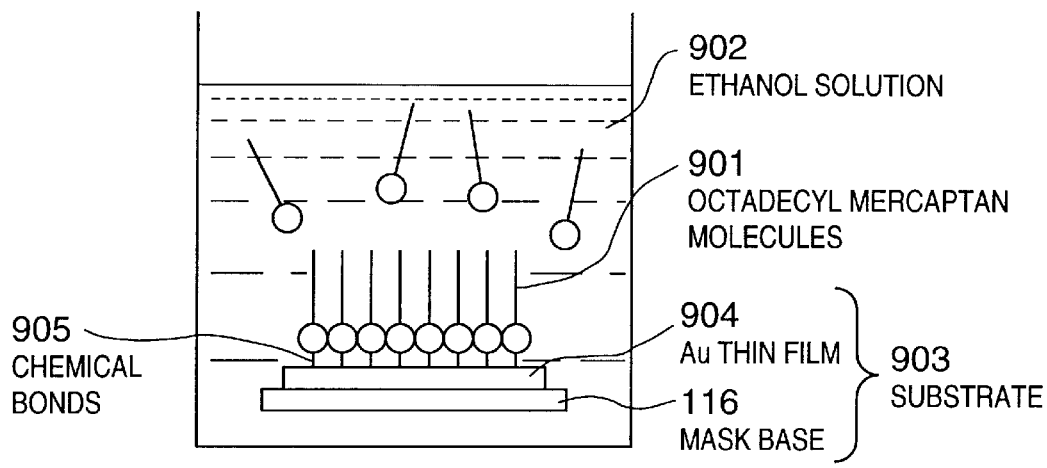
FIG. 9 is a diagram useful in describing a SAM (Self-Assembled Monolayer) formation method.

As shown in FIG. 9, the SAM formation method is a method of forming a monomolecular film on a substrate by physically adsorbing or chemically bonding a single-molecule layer on or to the substrate in a solution.

A specific example of the SAM formation method will now be described. Instead of the thin film 404 of chromium mentioned above, a thin film of gold is formed as the metallic thin film constituting the thin-film shaped mask 410. As illustrated in FIG. 9, the thin-film shaped mask 410 is submerged as a substrate 903 in an ethanol solution 902 in which octadecyl mercaptan has been dissolved to a concentration of 1 mM. The substrate is left in solution for 12 hours at room temperature. As a result, chemical bonds 905 are formed between the sulfur atoms of octadecyl mercaptan molecules 901 and the gold atoms, and the surface of a gold thin film 904 becomes covered with the octadecyl mercaptan molecules 901. The mercaptan molecules 901 form a monomolecular film in which the methyl radicals, which are the hydrophilic ends, are oriented in good order and are directed away from the substrate 903. As a result, the outermost surface of the substrate 903 is capable of exhibiting the hydrophobic property.

Conversely, in order for the outermost surface of the substrate to exhibit the hydrophilic property, it will suffice to select a combination of a substrate and molecules that will cause the molecules having hydrophilic portions therein to be adsorbed on or bonded to the substrate with their hydrophilic portions directed outward.

Thus, by suitably combining and selecting molecules and a substrate, it is possible with the SAM formation method to change the affinity (i.e., to obtain the hydrophilic or hydrophobic property) of the outermost surface.

A gas-phase adsorption method can be mentioned as a third method of forming the adsorption preventing thin film (A) whose surface affinity has been regulated.

Figure 10:
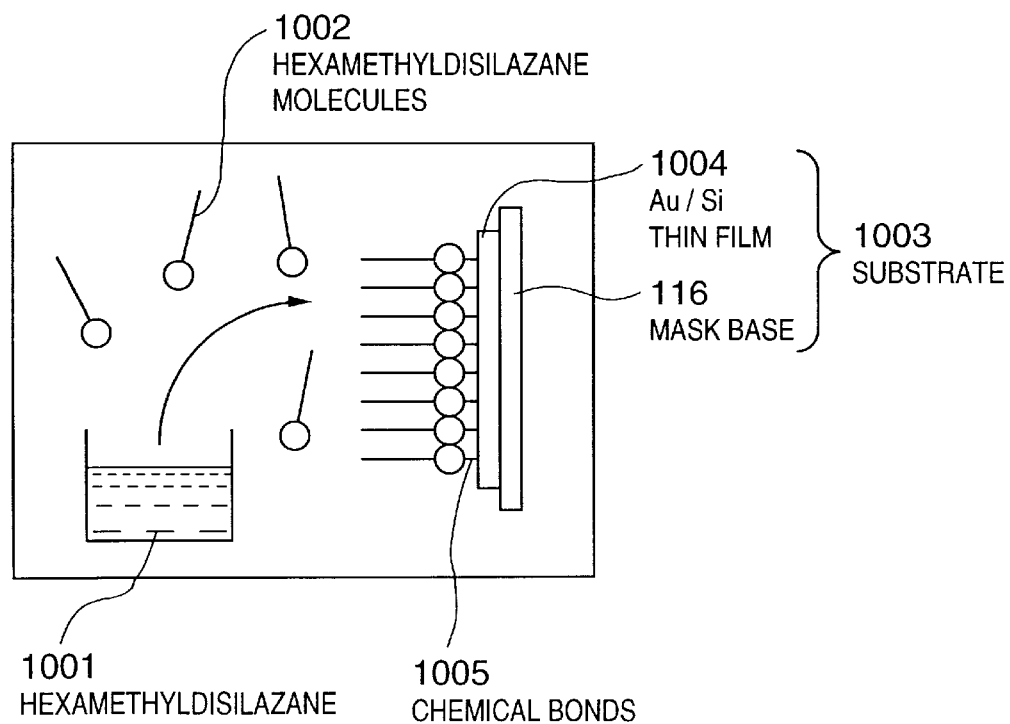
FIG. 10 is a diagram useful in describing a gas-phase adsorption method.

As shown in FIG. 10, the gas-phase adsorption method forms a molecular film on a substrate by physically adsorbing or chemically bonding the film on or to the substrate in the gas phase.

A specific example of the gas-phase adsorption method will now be described. Instead of the thin film 404 of chromium mentioned above, an Au/Si thin film is formed by the sputtering method or CVD method as the metallic thin film constituting the thin-film shaped mask 410. A treatment is then applied to effect termination with HF. As shown in FIG. 10, a vessel containing hexamethyldisilazane, which is one silane coupling material, and the thin-film shaped mask 410 serving as a substrate 1003 are placed in a hermetically sealed vessel, the interior of the sealed vessel is heated to 50° C. and the vessel is left as is for 12 hours. As a result, hexamethyldisilazane molecules 1002 are vaporized into a gas and are adsorbed onto the substrate 1003. Chemical bonds 1005 are formed between silicon atoms of the Au/Si thin film 1004 on the substrate 1003 and silicon atoms of the hexamethyldisilazane molecules 1002, and the surface of Au/Si thin film 1004 becomes covered with the trimethyl radicals of the hexamethyldisilazane molecules 1002. There is formed a molecular film in which the hydrophobic trimethyl radicals are oriented in good order and are directed away from the substrate 1003. As a result, the outermost surface of the substrate 1003 is capable of exhibiting the hydrophobic property.

Conversely, in order for the outermost surface of the substrate to exhibit the hydrophilic property, it will suffice to select a combination of a substrate and molecules that will cause the molecules having hydrophilic portions therein to be bonded to the substrate with their hydrophilic portions directed outward.

Thus, by suitably combining and selecting molecules and a substrate, it is possible with the gas-phase adsorption method to change the affinity (i.e., to obtain the hydrophilic or hydrophobic property) of the outermost surface.

Examples of the substrate 108 to be treated for application to the evanescent light exposure apparatus of the present invention include a semiconductor substrate of Si, GaAs or InP, etc., an insulating substrate of glass, quartz or BN, etc., or a member obtained by forming a film of a metal, oxide or nitride on any of these substrates.

In the evanescent light exposure apparatus of the present invention, it is important that the mask 106 for evanescent light exposure and the resist 107/substrate 108 be adhered in such a manner that the spacing between them becomes less than 100 nm at least, preferably less than 10 nm, over the entire exposure surface. This means that the substrate selected should be as flat as possible.

Similarly, the resist 107 used in this invention is required to be flat, with little surface unevenness. Further, since the light that emerges from the mask 106 is attenuated exponentially with distance from the mask, the thickness of the resist 107 is required to be as small as possible, i.e., less than 100 nm at least, in view of the fact that it is difficult to achieve exposure at resist thicknesses above 100 nm and the fact that the light spreads within the resist in scattering fashion and broadens the width of the exposure patterns.

Accordingly, it is necessary to use a resist material coating method such that the resist will be extremely flat and have a film thickness of less than 100 nm at least, and preferably less than 10 nm, and a surface unevenness of less than 100 nm at least, and preferably less than 10 nm.

In order to satisfy these conditions, a commonly employed optical resist material may be dissolved in a solvent to make its viscosity as low as possible, and a coating of the material may be produced by spin coating so as to obtain a resist that is extremely thin and uniform in thickness.

Another example of an optical resist material coating method is the LB method for forming multiple layers of monomolecular films on a substrate by applying monomolecular films to the substrate a prescribed number of times, wherein the monomolecular films are such that amphiphatic optical resist molecules having hydrophobic and hydrophilic functional groups in one molecule are arrayed on a water surface.

Further, the SAM formation method may be used, in which a monomolecular film of an optical resist material is formed on a substrate by physically adsorbing or chemically bonding a single-molecule layer on or to the substrate in a solution or in the gas phase.

Among the coating methods available, the LB method and SAM formation method make it possible to form an extremely thin resist film to have a uniform thickness and a very flat surface. Accordingly, these are optical resist coating methods that are extremely well suited for application to the evanescent light exposure apparatus of the present invention.

Figure 11A:
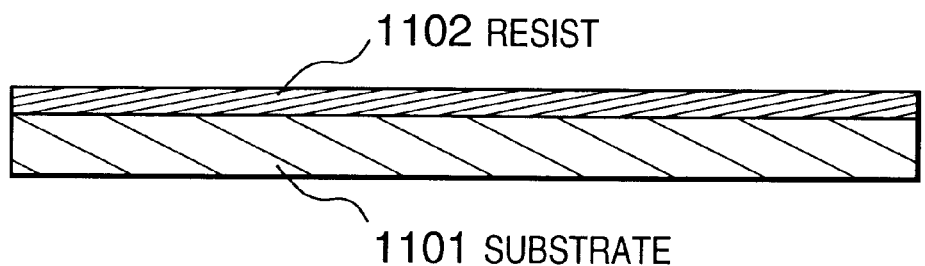
FIGS. 11A and 11B are diagrams showing the arrangement of a resist and substrate.
Figure 11B:
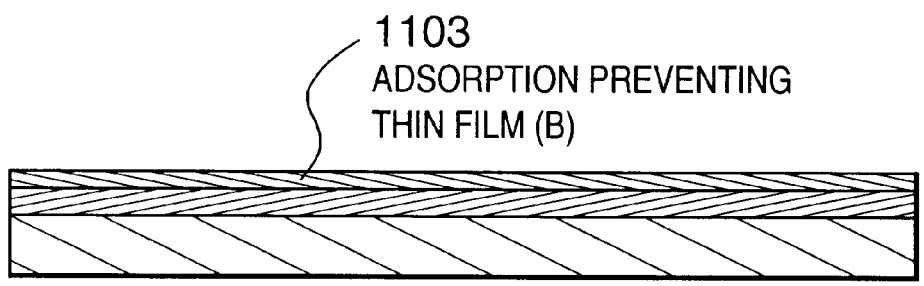

As shown in FIGS. 11A and 11B, an adsorption preventing thin film (B) 1103 is formed on a resist 1102 on a substrate 1101 using the above-described LB method, SAM formation method or gas-phase adsorption method, and the top surface is made one having an affinity opposite that of the surface of the adsorption preventing thin film (A) formed on the front side of the mask for evanescent light exposure (i.e., on surface is made hydrophilic and the other is made hydrophobic).

For example, it will suffice to select the adsorption preventing thin-film materials in such a manner that the outermost surfaces of the adsorption preventing thin films (A) and (B) that are to be adhered to each other will exhibit opposite affinities, so that the outermost surface of the adsorption preventing thin film (B) on the resist/substrate will be hydrophilic in a case where the outermost surface of the adsorption preventing thin film (A) on the front side of the mask for evanescent light exposure is hydrophobic, while the outermost surface of the adsorption preventing thin film (B) on the resist/substrate will be hydrophobic in a case where the outermost surface of the adsorption preventing thin film (A) is hydrophilic.

Though an example in which the adsorption preventing thin film (B) 1103 is formed on the resist 1102/substrate 1101 has been described above, the invention as claimed is not limited to this example and covers also utilization of the affinity (hydrophilic or hydrophobic) of the surface of the resist 1102 itself.

For example, assume that the resist 1102 has a surface that is hydrophobic, such as a resist RD2000™ manufactured by Hitachi Chemical Co., Ltd. If the surface of the adsorption preventing thin film (A) on the side of the mask for evanescent light exposure is a hydrophilic material in this case, the adsorption preventing thin film (B) is not formed on the resist 1102/substrate 1101 but can be used directly in the evanescent light exposure apparatus of the present invention as the resist/substrate for being treated.

Similarly, assume that the resist 1102 has a surface that is hydrophilic, such as a resist AZ1500™ manufactured by Hoechst Japan Ltd. If the surface of the adsorption preventing thin film (A) on the side of the mask for evanescent light exposure is a hydrophobic material in this case, the adsorption preventing thin film (B) is not formed on the resist 1102/substrate 1101 but can be used directly in the evanescent light exposure apparatus of the present invention as the resist/substrate for being treated.

In performing exposure using evanescent light, it is required that the spacing between the mask 106 for evanescent light exposure and the resist 107/substrate 108 be less than 100 nm and, moreover, that this spacing be maintained without variance.

For this reason, the substrate used in exposure employing evanescent light should not be one having surface unevenness of more than 100 nm on which a pattern already possessing unevenness is formed through another lithographic process.

Accordingly, the substrate used in evanescent light exposure preferably is one that is already as flat as possible at the initial stage of the process and that has not been subjected to many other processes. When the exposure process using evanescent light and another lithographic process are combined, therefore, it is preferred that the evanescent light exposure process be performed first to the extent that this is possible.

Further, the strength of the evanescent light 205 that emerges from the minute aperture patterns 204 on the mask for evanescent light exposure in FIG. 2 differs depending upon the size of the minute aperture patterns 204. If the minute apertures have various sizes, therefore, the degree to which the exposing light exposes the resist 206 will vary, making it difficult to achieve uniform pattern formation. To avoid this, therefore, it is necessary to uniformalize the widths of the minute aperture patterns decided by the metal patterns on the evanescent light exposure mask used in the one evanescent light exposure process.

The description rendered above relates to an apparatus in which the entire surface of a substrate is exposed to evanescent light at one stroke using an evanescent light exposure mask that corresponds to the entire surface of the substrate. However, the concept of the present invention is not limited to this arrangement. The apparatus may be of the step-and-repeat type, in which use is made of an evanescent light exposure mask smaller than the substrate to expose only a portion of the substrate to evanescent light exposure, with this step being repeatedly executed while changing the location of the substrate exposed.

Thus, in accordance with the embodiment described above, a pair of adsorption preventing thin films are formed between a metallic thin film of a mask for evanescent light exposure and a resist/substrate in an exposure apparatus for exposing an object using evanescent light that emerges from minute aperture patterns that have been formed in the mask. As a result, it is possible to reduce the adsorbability of the mask with respect to the exposed object. When the mask is peeled off, the mask pattern will not be adsorbed onto the surface of the exposed object and will not be stripped off the mask base, and the mask base will not be damaged or destroyed. This makes it possible to increase yield.

As many apparently widely different embodiments of the present invention can be made without departing from the spirit and scope thereof, it is to be understood that the invention is not limited to the specific embodiments thereof except as defined in the appended claims.

What is claimed is:

1. A mask for performing exposure using evanescent light employed in an evanescent light exposure apparatus, comprising:

a main body including a film structure with minute aperture patterns formed on a front side, with the front side to be adhered to an object to be exposed in the evanescent light exposure apparatus, wherein said main body is irradiated with light from a back side thereof, and the object is exposed to the minute aperture patterns, whereby the patterns are transferred thereto, by evanescent light that emerges from said minute aperture patterns; and adsorption preventing means provided on an outermost surface of said front side of said main body.

2. An object to be exposed in an evanescent light exposure apparatus in which a mask having a main body including a film structure on which minute aperture patterns are formed is disposed with its front side adhering to said object to be exposed, the mask is to be irradiated with light from a back side thereof, and said object is exposed to the minute aperture patterns, whereby the patterns are transferred thereto, by evanescent light that emerges from the minute aperture patterns, said object comprising:

an outermost surface to be exposed; and adsorption preventing means disposed on a said outermost surface for preventing adsorption between said outermost surface and the front side of the mask when said outermost surface and the front side of the mask are adhered to each other in the evanescent light exposure apparatus.

3. An evanescent light exposure apparatus, comprising:

a mask having a main body including a film structure on which minute aperture patterns are formed, said film structure including a front side adhering to an object to be exposed, with said mask being irradiated with light from a back side thereof and the object being exposed to the minute aperture patterns, whereby the patterns are transferred thereto, by evanescent light that emerges from said minute aperture patterns; and adsorption preventing means provided between a front side of said mask and an outermost surface of the object to be exposed.

4. An evanescent light exposure method in which a mask having a main body including a film structure on which minute aperture patterns are formed is disposed with a front side adhering to an object to be exposed, said method comprising the steps of:

irradiating the mask with light from a back side of the mask;

exposing the object to the minute aperture patterns, whereby the patterns are transferred thereto by evanescent light that emerges from said minute aperture patterns; and providing an outermost surface on the front side of the mask and an outermost surface of the object to include respective materials one of which has a hydrophilic property and the other of which has a hydrophobic property.

* * * * *

UNITED STATES PATENT AND TRADEMARK OFFICE
CERTIFICATE OF CORRECTION

PATENT NO.    : 6,187,482 B1
DATED         : February 13, 2001
INVENTOR(S)   : Ryo Kuroda et al.

It is certified that error appears in the above-identified patent and that said Letters Patent is hereby corrected as shown below:

Column 1,
Line 64, "ay" should read -- may --.

Column 2,
Line 65, "produced" should read -- produce --.

Column 5,
Line 4, 'broadened" should read -- broaden --.

Column 8,
Line 41, "property ,in" should read -- property, in --.

Column 13,
Line 8, "on" should read -- one --.

Signed and Sealed this

Eleventh Day of December, 2001

*Attest:*

NICHOLAS P. GODICI
*Attesting Officer*    *Acting Director of the United States Patent and Trademark Office*